United States Patent

Boochakorn

[11] Patent Number: 6,121,887
[45] Date of Patent: Sep. 19, 2000

[54] AUTOMATED DETECTION OF A SIGNIFICANTLY BENT LEAD OF A PLURALITY OF LEADS ON AN INTEGRATED CIRCUIT PACKAGE

[75] Inventor: Sa-Nguan Boochakorn, Bangkok, Thailand

[73] Assignee: Advanced Micro Devices, Inc., Sunnyvale, Calif.

[21] Appl. No.: 09/390,450

[22] Filed: Sep. 7, 1999

[51] Int. Cl.[7] ................................................. G08B 21/00
[52] U.S. Cl. .................................. 340/686.1; 340/686.2; 340/686.6
[58] Field of Search ................................ 340/686.1, 689, 340/686.2, 686.4, 686.6, 674, 679, 825.5; 140/147, 105; 72/14.4, 702

[56] References Cited

U.S. PATENT DOCUMENTS

| | | | |
|---|---|---|---|
| 3,687,172 | 8/1972 | Suverkropp | 140/147 |
| 4,642,734 | 2/1987 | Anderson | 340/825.5 |
| 4,813,255 | 3/1989 | Birk et al. | 72/14.4 |
| 5,189,708 | 2/1993 | Suzuki et al. | 382/151 |

Primary Examiner—Daniel J. Wu
Assistant Examiner—Van T. Trieu
Attorney, Agent, or Firm—Monica H. Choi

[57] ABSTRACT

An apparatus and method for automatically detecting when a lead of an integrated circuit package is bent more than a predetermined bend distance. The integrated circuit package has a plurality of leads aligned in a row with a predetermined separation distance between each two adjacent leads. A comb structure having a plurality of teeth is lowered toward the row of the plurality of leads on the integrated circuit package. A tooth of the comb structure fits between respective two adjacent leads of the row of plurality of leads on the integrated circuit package when each of the respective two adjacent leads is bent toward each other with less than the predetermined bend distance as the comb structure is lowered toward the row of plurality of leads on the integrated circuit package. On the other hand, the tooth of the comb structure does not fit between the respective two adjacent leads when any of the respective two adjacent leads is bent toward each other with more than the predetermined bend distance as the comb structure is lowered toward the row of plurality of leads on the integrated circuit package. A monitor detects when any tooth of the comb structure does not fit between the respective two adjacent leads as the comb structure is lowered toward the row of plurality of leads on the integrated circuit package, and in that case, a warning indicator provides a warning signal.

21 Claims, 5 Drawing Sheets

AUTOMATED DETECTION OF A SIGNIFICANTLY BENT LEAD OF A PLURALITY OF LEADS ON AN INTEGRATED CIRCUIT PACKAGE

TECHNICAL FIELD

The present invention relates generally to IC (Integrated Circuit) package inspection systems, and more particularly, to an apparatus and method for automatically detecting any significantly bent lead of a plurality of leads on an integrated circuit package.

BACKGROUND OF THE INVENTION

Referring to FIG. 1A, a typical IC (Integrated Circuit) package 102 includes a plurality of leads for coupling nodes of an IC die within the IC package 102 to a system external to the IC package 102. FIG. 1A shows a bottom view of the IC package 102, and each side of the IC package 102 includes a row of a plurality of leads.

A first side 104 of the IC package 102 includes a row of a first lead 106, a second lead 108, and a third lead 110. A second side 112 of the IC package 102 includes a row of a fourth lead 114, a fifth lead 116, and a sixth lead 118. A third side 120 of the IC package 102 includes a row of a seventh lead 122, an eighth lead 124, and a ninth lead 126. A fourth side 128 of the IC package 102 includes a row of a tenth lead 130, an eleventh lead 132, and a twelfth lead 134. A typical IC package includes more numerous leads to a side of the IC package. However, three leads to a side of the IC package 102 are shown in FIG. 1A for clarity of illustration.

Referring to FIG. 1B, a side view of the first side 104 of the IC package 102 of FIG. 1A is shown. The side view of the first side 104 of the IC package 102 in FIG. 1B also shows a side view of the fourth lead 114 on the second side 112 of the IC package 102 and a side view of the twelfth lead 134 on the fourth side 128 of the IC package 102. Any two adjacent leads of the row of plurality of leads are separated from each other by a predetermined separation distance.

Referring to FIG. 2, the second lead 108 is bent toward the first lead 106. A lead of an IC package 102 may be significantly bent beyond a tolerance specification. During inspection of the IC package 102 in the prior art, an operator visually inspects the leads of the IC package 102 to determine whether any lead of the IC package 102 is significantly bent beyond the tolerance specification. However, such visual inspection by a human operator is unreliable and slows down the production of IC packages. A machine vision system may be used for inspection of the leads of the IC package 102. However, such a machine vision system is relatively costly.

Thus, a mechanism is desired for automatically detecting when any lead of an integrated circuit package is significantly bent beyond the tolerance specification in an effective and economical manner.

SUMMARY OF THE INVENTION

Accordingly, a general aspect of the present invention includes an apparatus and method for automatically detecting when a lead of an integrated circuit package is bent more than a predetermined bend distance. The predetermined bend distance is determined by the tolerance specification for the integrated circuit package. The integrated circuit package has a plurality of leads aligned in a row with a predetermined separation distance between each two adjacent leads.

In a general aspect of the present invention, a comb structure having a plurality of teeth is lowered toward the row of the plurality of leads on the integrated circuit package. A tooth of the comb structure fits between respective two adjacent leads of the row of plurality of leads on the integrated circuit package when each of the respective two adjacent leads is bent toward each other with less than the predetermined bend distance as the comb structure is lowered toward the row of plurality of leads on the integrated circuit package. When any of the respective two adjacent leads is bent toward each other with less than the predetermined bend distance, the tooth unbends that lead as the tooth fits between the respective two adjacent leads.

On the other hand, the tooth of the comb structure does not fit between the respective two adjacent leads when any of the respective two adjacent leads is bent toward each other with more than the predetermined bend distance as the comb structure is lowered toward the row of plurality of leads on the integrated circuit package. A monitor detects when any tooth of the comb structure does not fit between the respective two adjacent leads as the comb structure is lowered toward the row of plurality of leads on the integrated circuit package. A warning indicator provides a warning signal when any tooth of the comb structure does not fit between the respective two adjacent leads as the comb structure is lowered toward the row of plurality of leads on the integrated circuit package. Such a warning signal indicates that a lead of the integrated circuit package is significantly bent beyond a tolerance specification and that such a bent lead needs to be reworked to correct the undesired bending.

In this manner, any significantly bent lead of the integrated circuit package is automatically detected in an effective and economical manner.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1A, 1B, 2, 3, 4, 5, 6, 7, 8, 9, 10, and 11 refer to elements having similar structure and function.

DETAILED DESCRIPTION

Figure 1A:
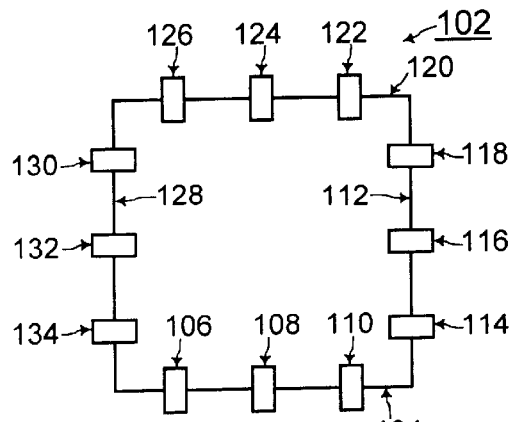
FIG. 1A shows a plurality of leads at the bottom of an example IC package.
Figure 1B:
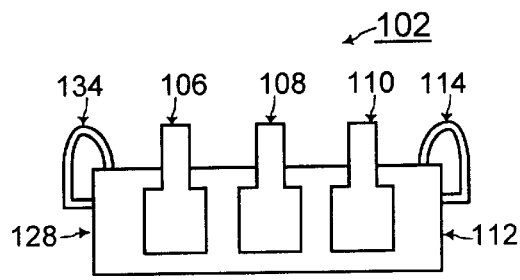
FIG. 1B shows a side view of the IC package of FIG. 1A.
Figure 2:
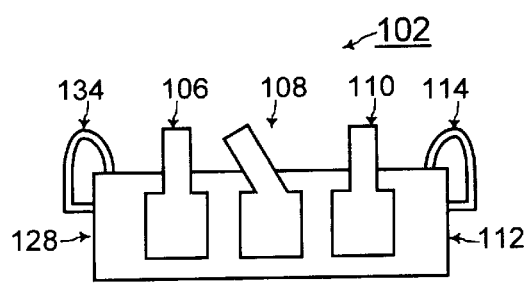
FIG. 2 shows the side view of the IC package of FIG. 1A with one of the leads being undesirably bent beyond a tolerance specification.
Figure 3:
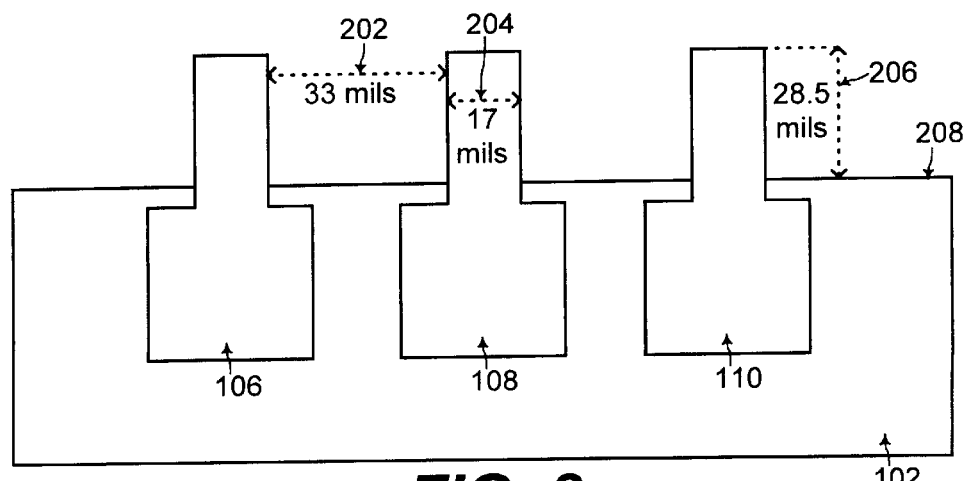
FIG. 3 shows example dimensions of the leads of the side view of the IC package of FIG. 1A.

For automatically detecting when a lead on the IC package 102 is bent more than a predetermined bend distance, the dimensions of the row of leads on the IC package 102 is determined. FIG. 3 shows example dimensions for the row of leads 106, 108, and 110 of the IC package 102 when the leads are not bent toward each other.

The first lead 106 and the second lead 108 which form an example of two adjacent leads are separated from each other with a predetermined separation distance 202 from the edge of the first lead 106 to the edge of the second lead 108. An example predetermined separation distance 202 is 33 mils (wherein one mil is one thousandth of an inch). Each of the leads typically has a lead width 204, and an example lead width is 17 mils (wherein one mil is one thousandth of an inch). Each of the leads has a lead height 206 from a base surface 208 of the IC package 102. An example of the lead height 206 is 28.5 mils (wherein one mil is one thousandth of an inch).

Figure 4:
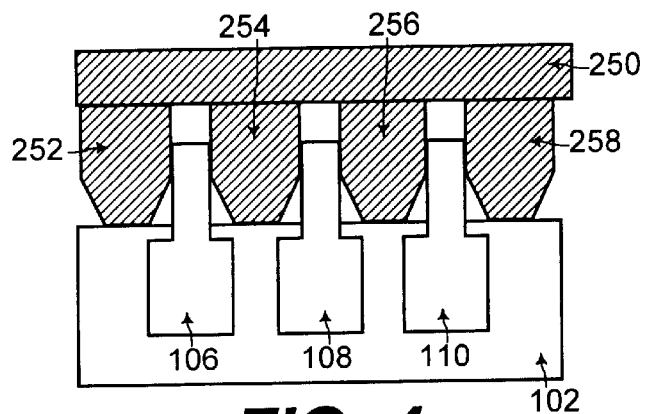
FIG. 4 shows a comb structure having a plurality of teeth with each tooth fitting between respective two adjacent leads of the IC package when each of the respective two adjacent leads are not bent beyond a predetermined bend distance, according to an embodiment of the present invention.

Referring to FIG. 4, for automatically detecting when a lead on the IC package 102 is bent more than a predetermined bend distance, the main aspect of the present invention is a comb structure 250. The comb structure has a plurality of teeth including a first tooth 252, a second tooth 254, a third tooth 256, and a fourth tooth 258. If each of the leads in the row of leads 106, 108, and 110 is not bent more than the predetermined bend distance, then each of the teeth 254 and 256 of the comb structure 250 fits between a respective adjacent two leads when the comb structure is lowered down toward the row of leads 106, 108, and 110. Referring to FIG. 4, the second tooth 254 fits between the first lead 106 and the second lead 108 when each of the first lead 106 and second lead 108 are not to bent toward each other more than the predetermined bend distance. Similarly, the third tooth 256 fits between the second lead 108 and the third lead 110 when each of the second lead 108 and third lead 110 are not bent toward each other more than the predetermined bend distance. The first tooth 252 which is an end tooth on the comb structure 250 fits to the left of the first lead 106 when the first lead 106 is not bent toward the left more than the predetermined bend distance. Similarly, the fourth tooth 258 which is an end tooth on the comb structure 250 fits to the right of the third lead 110 when the third lead 110 is not bent toward the right more than the predetermined bend distance.

Figure 5:
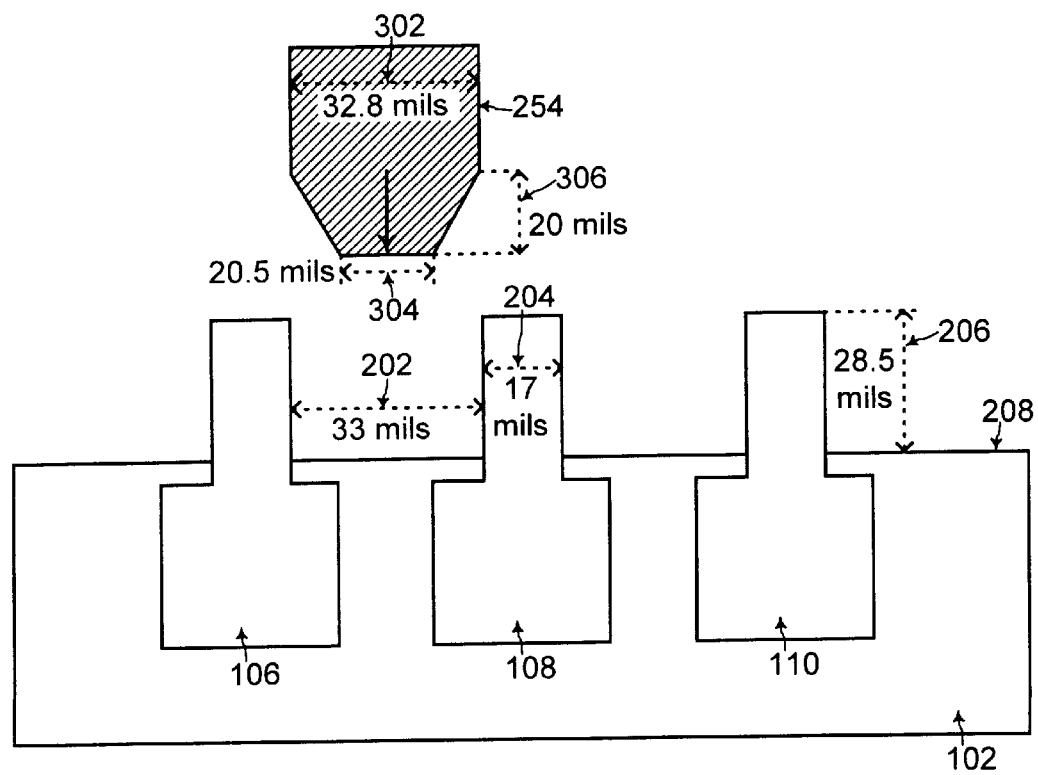
FIG. 5 shows example dimensions of a tooth of the comb structure of FIG. 4 for the example dimensions of the leads of the IC package of FIG. 3, according to an embodiment of the present invention.

The predetermined bend distance is determined by tolerance specifications for an integrated circuit package product. Referring to FIG. 5, example dimensions for the second tooth 254 of the comb structure 250 is shown for the example integrated circuit package dimensions of FIG. 3 and for an example predetermined bend distance of 7 mils (wherein one mil is one thousandth of an inch). A top tooth width of the tooth 254 is substantially equal to the predetermined separation distance 202 from the edge of the first lead 106 to the edge of the second lead 108. For the example predetermined separation distance of 33 mils, the top tooth width is 32.8 mils (wherein one mil is one thousandth of an inch).

A bottom tooth width 304 of the tooth 254 is determined by the predetermined bend distance. The bottom tooth width 304 is slightly greater than the predetermined separation distance 202 minus twice the predetermined bend distance. For the example predetermined separation distance 202 of 33 mils and for the example predetermined bend distance of 7 mils, the bottom tooth width 304 is 20.5 mils (wherein one mil is one thousandth of an inch).

The tooth 254 is angled at the bottom of the tooth 254 for a bottom tooth height 306 with the tooth 254 having the top tooth width 302 above the bottom tooth height 306 and with the tooth 254 being tapered from the top tooth width 302 to the bottom tooth width 304 below the bottom tooth height 306. The bottom tooth height 306 is designed to be substantially less than the lead height 206 from the base surface 208 of the IC package 102. For the example lead height 206 of 28.5 mils, the bottom tooth height 306 is 20 mils (wherein one mil is one thousandth of an inch).

Figure 6:
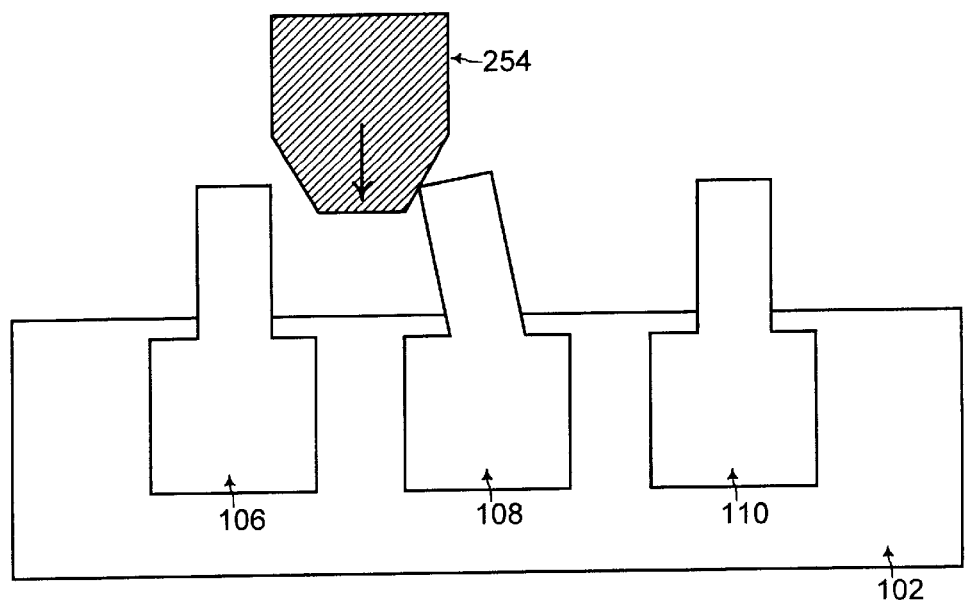
FIGS. 6 and 7 illustrate that a tooth of the comb structure of FIG. 4 still fits between respective two adjacent leads of the IC package when any one of the respective two adjacent leads is bent less than the predetermined bend distance, according to an embodiment of the present invention.
Figure 7:
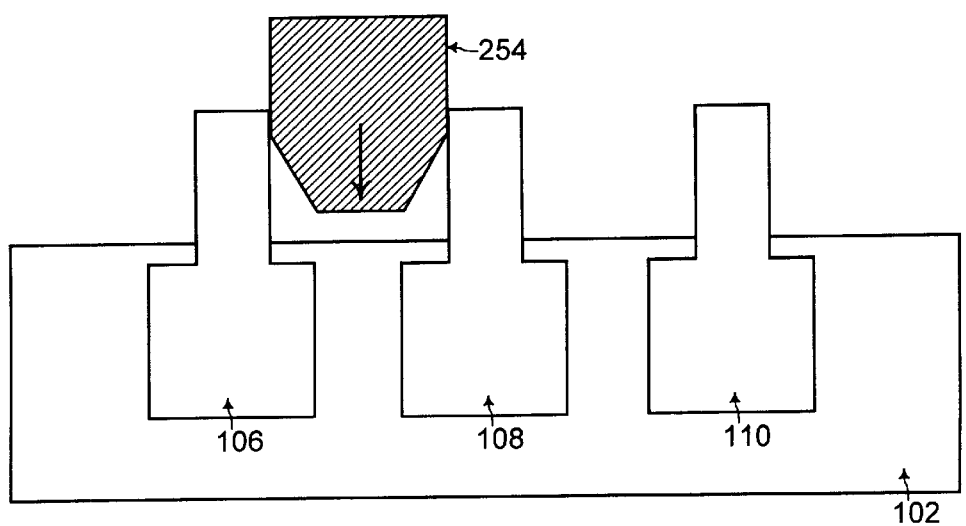

With such dimensions of the tooth 254, the tooth 254 fits between the first lead 106 and the second lead 108 as the tooth 254 is lowered toward the IC package 102 when each of the first lead 106 and the second lead 108 is not bent toward each other more than the predetermined bend distance. As illustrated in FIG. 6, assume that the second lead 108 is bent toward the first lead 106 with less than the predetermined bend distance. In that case, as the tooth 254 is further lowered down toward the IC package 102, the bent second lead 108 slides along the tapered surface of the bottom tooth height 306 of the tooth 254 until the tooth 254 fits between the first lead 106 and the second lead 108 as shown in FIGS. 6 and 7. In addition, referring to FIG. 7, when the second lead 108 is bent toward the first lead 106 with less than the predetermined bend distance, the tooth 254 unbends the second lead 108 when the tooth 254 fits between the first lead 106 and the second lead 108.

The tooth 254 is comprised of a smooth hard material such as polished hard carbide steel for example. With such a smooth and hard material for the tooth 254, the second lead 108 that is bent with less than the predetermined bend distance easily slides along the tapered surface of the bottom tooth height 306 of the tooth 254. Furthermore, with such a hard material for the tooth 254, the tooth 254 unbends the second lead 108 when the tooth 254 fits between the first lead 106 and the second lead 108.

Figure 8:
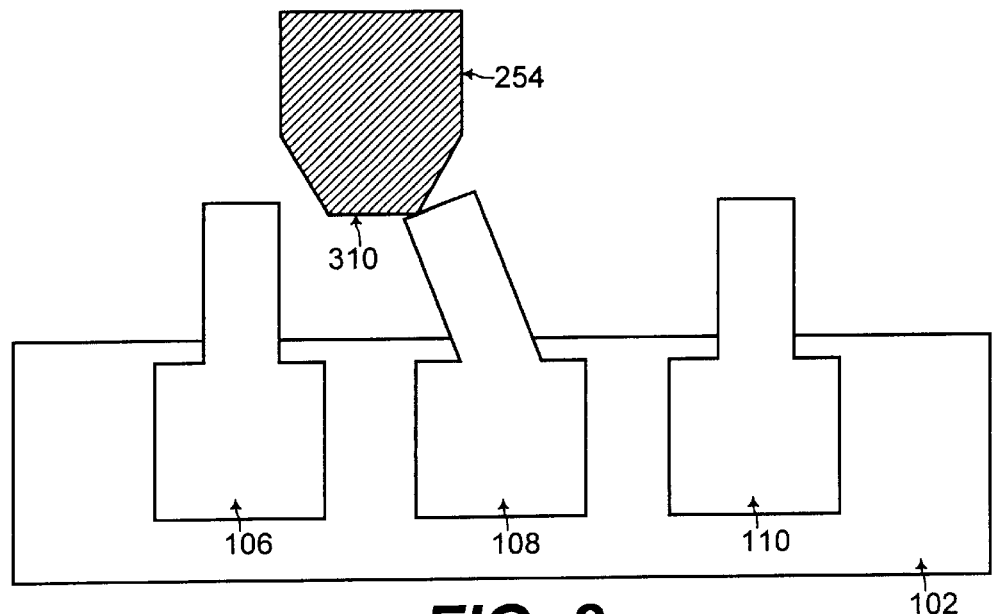
FIG. 8 illustrates that a tooth of the comb structure of FIG. 4 does not fit between respective two adjacent leads of the IC package when any one of the respective two adjacent leads is bent more than the predetermined bend distance, according to an embodiment of the present invention.

On the other hand, as illustrated in FIG. 8, assume that the second lead 108 is bent toward the first lead 106 with more than the predetermined bend distance. In that case, as the tooth 254 is lowered down toward the IC package 102, a bottom surface 310 of the tooth 254 contacts the bent second lead 108 when the bottom surface 310 of the tooth reaches the bent second lead 108 as shown in FIG. 8. At that point, the bent second lead 108 blocks the tooth 254 and thus the comb structure 250 from being lowered further, and the tooth 254 does not fit between the first lead 106 and the second lead 108.

Figure 9:
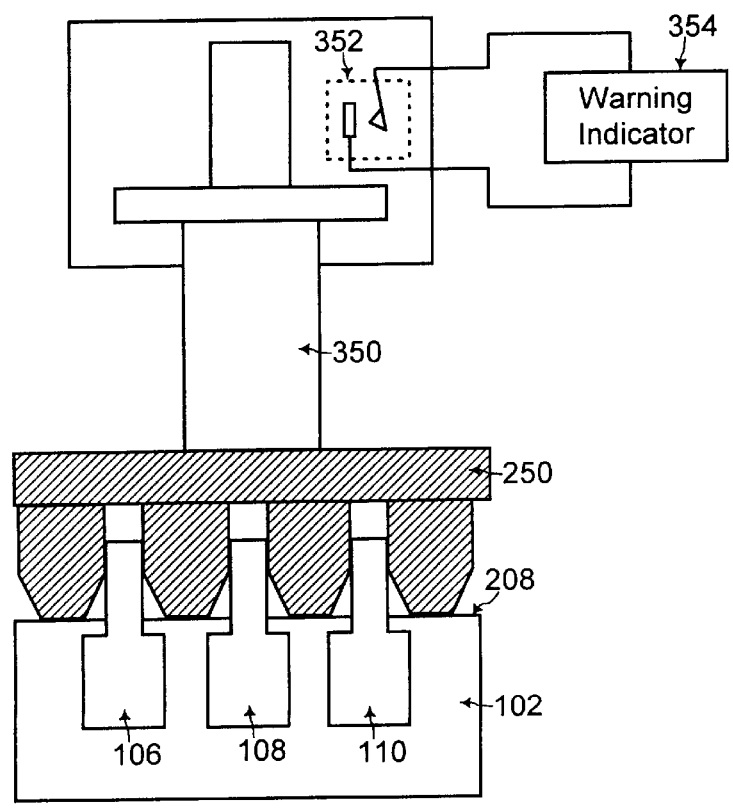
FIG. 9 shows a warning indicator that does not provide a warning signal when each tooth of the comb structure of FIG. 4 fits between respective two adjacent leads of the IC package, according to an embodiment of the present invention.

In an embodiment of the present invention, a monitor detects when any tooth of the comb structure 250 does not fit between a respective two adjacent leads on the integrated circuit package as the comb structure 250 is lowered toward the row of leads on the IC package 102. Referring to FIG. 9, the comb structure 250 is mounted on a pneumatic cylinder 350 that moves the comb structure 250 down toward or up away from the row of leads 106, 108, and 110. The monitor that detects when any tooth of the comb structure 250 does not fit between a respective two adjacent leads on the IC package 102 is a switch 352 that is disposed on the pneumatic cylinder 350.

Referring to FIG. 9, when all of the leads of the row of leads 106, 108, and 110 is not bent toward each other with more than the predetermined bend distance, all of the teeth of the comb structure 250 fit within the space between the leads 106, 108, and 110 as the comb structure 250 is lowered toward the row of leads on the IC package 102 by the pneumatic cylinder 350. In that case, the pneumatic cylinder 350 with the comb structure 250 is lowered to an end point when the bottom surface of the each of the teeth of the comb structure 250 makes contact with the base surface 208 of the IC package 102 as illustrated in FIG. 9.

As the pneumatic cylinder 350 is sufficiently lowered to the end point as illustrated in FIG. 9, the pneumatic cylinder trips the switch 352 to be open. The switch 352 is coupled to a warning indicator 354, and the open switch 352 indicates to the warning indicator 354 that the row of the plurality of leads 106, 108, and 110 of the IC package 102 are not bent more than the predetermined bend distance.

Figure 10:
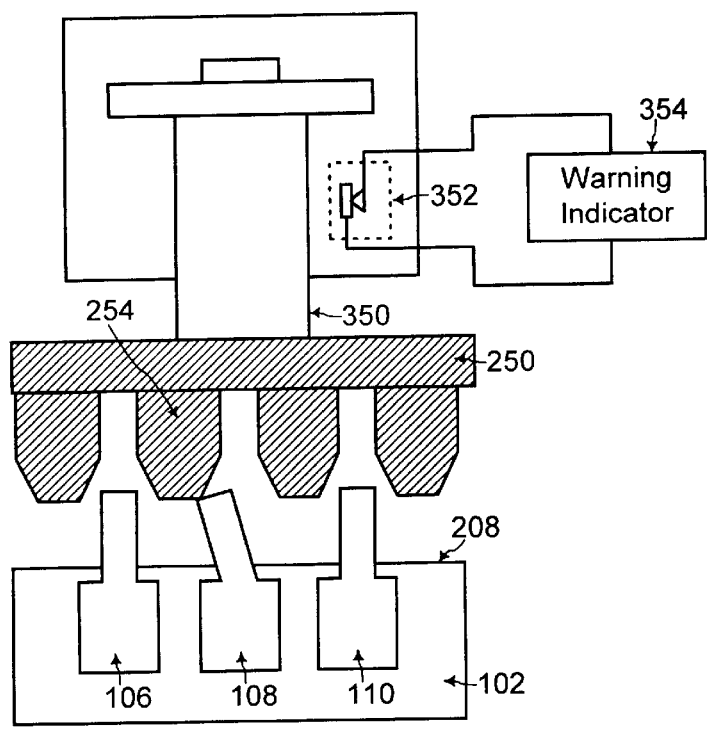
FIG. 10 shows the warning indicator that provides a warning signal when any tooth of the comb structure of FIG. 4 does not fit between respective two adjacent leads of the IC package, according to an embodiment of the present invention.

Referring to FIG. 10, if one of the leads (such as the second lead 108) of the row of leads 106, 108, and 110 is bent toward another lead (such as toward the first lead 106) with more than the predetermined bend distance, then the second tooth 254 of the comb structure 250 does not fit within the space between the first lead 106 and the second lead 108 as the comb structure 250 is lowered toward the row of leads on the IC package 102 by the pneumatic cylinder 350.

In that case, the pneumatic cylinder 350 with the comb structure 250 is not sufficiently lowered to reach the end point. Thus, the bottom surface of each of the teeth of the comb structure 250 does not make contact with the base surface 208 of the IC package 102 as illustrated in FIG. 9. Because the pneumatic cylinder 350 does not reach the end point, the pneumatic cylinder 350 does not trip the switch 352 to be open, and the switch 352 is closed. The switch 352 is coupled to the warning indicator 354, and the closed switch 352 indicates to the warning indicator 354 that a lead of the row of the plurality of leads 106, 108, and 110 of the IC package 102 is bent more than the predetermined bend distance.

In that case, the warning indicator 354 generates a warning signal to indicate to an operator that a lead of the row of the plurality of leads 106, 108, and 110 of the IC package 102 is bent more than the predetermined bend distance such that the operator may rework and unbend such a lead. The warning indicator 354 may be comprised of a lighting device that is turned on or of an audible alarming device that is turned on when a lead of the row of the plurality of leads 106, 108, and 110 of the IC package 102 is bent more than the predetermined bend distance.

Referring to FIGS. 9 and 10, the row of plurality of leads 106, 108, and 110 of the IC package 102 faces up toward the comb structure 250 as the comb structure 250 is lowered toward the row of plurality of leads 106, 108, and 110. If the IC package 102 is delivered to the comb structure 250 with the row of plurality of leads 106, 108, and 110 facing down away from the comb structure 250, then the IC package 102 is flipped over such that the row of plurality of leads 106, 108, and 110 of the IC package 102 faces up toward the comb structure 250.

Figure 11:
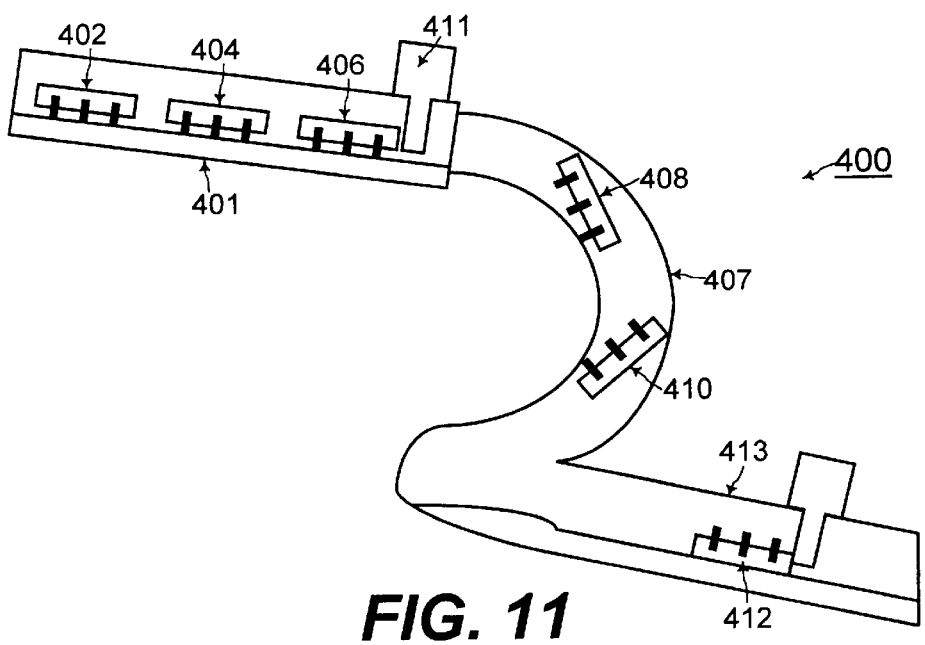
FIG. 11 shows an integrated circuit package flipper that turns over an integrated circuit package to ensure that the row of the plurality of leads on the integrated circuit package is facing toward the teeth of the comb structure, according to an embodiment of the present invention.

Referring to FIG. 11, an integrated circuit package flipper 400 flips over such an integrated circuit package such that the row of plurality of leads of the IC package faces up toward the comb structure 250. In a starting portion 401 of the integrated circuit package flipper 400, a plurality of integrated circuit packages 402, 404, and 406 are delivered with the row of plurality of leads facing downward. In a turning portion 407, integrated circuit packages 408 and 410 are turned over as the integrated circuit packages 408 and 410 travel down a turned tunnel of the turning portion 407. A first cylinder stopper 411 controls the entry of an integrated circuit package from the starting portion 401 to the turning portion 407 of the integrated circuit package flipper 400. When an integrated circuit package 412 reaches an end portion 413 of the integrated circuit package flipper 400, the integrated circuit package 412 has been turned over such that the row of plurality of leads of that integrated circuit package 412 faces up toward a comb structure.

In this manner, referring to FIGS. 9 and 10, the present invention is an effective and economical mechanism for automatically detecting when any lead of a row of plurality of leads of an integrated circuit package is bent toward another lead with more than a predetermined bend distance. The automated mechanism of the present invention is more reliable and efficient then visual inspection by a human operator of the prior art. In addition, the automated mechanism of the present invention is more economical than a machine vision system of the prior art. Furthermore, referring to FIGS. 6 and 7, when a lead of a row of plurality of leads of an integrated circuit package is bent toward another lead with less than a predetermined bend distance, the comb structure 250 of the present invention unbends such a bent lead.

The foregoing is by way of example only and is not intended to be limiting. For instance, the IC package 102 is by way of example only. A typical IC package may have more numerous leads. In addition, a side view of a comb structure is illustrated for a row of a plurality of leads of an integrated circuit package for clarity of illustration in FIGS. 4, 9, and 10. However, the present invention may be advantageously practiced with a plurality of comb structures being lowered toward a plurality of row of leads of the integrated circuit package, as would be apparent to one of ordinary skill in the art from the description herein.

Furthermore, as will be understood by those skilled in the art, the structures described herein may be made or used in the same way regardless of their position and orientation. Accordingly, it is to be understood that terms and phrases such as "left," "right," "bottom," "top," "lowered," "up," and "down" and as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

I claim:

1. An apparatus for automatically detecting when a lead of an integrated circuit package is bent more than a predetermined bend distance, the integrated circuit package having a plurality of leads aligned in a row with a predetermined separation distance between each two adjacent leads, the apparatus comprising:

a comb structure having a plurality of teeth;

wherein a tooth of said comb structure fits between a respective two adjacent leads of said row of plurality of leads on said integrated circuit package when each of said respective two adjacent leads is bent toward each other with less than said predetermined bend distance as said comb structure is lowered toward said row of plurality of leads on said integrated circuit package;

and wherein said tooth of said comb structure does not fit between said respective two adjacent leads when any of said respective two adjacent leads is bent toward each other with more than said predetermined bend distance as said comb structure is lowered toward said row of plurality of leads on said integrated circuit package;

a monitor for detecting when any tooth of said comb structure does not fit between said respective two adjacent leads as said comb structure is lowered toward said row of plurality of leads on said integrated circuit package; and a warning indicator that provides a warning signal when any tooth of said comb structure does not fit between said respective two adjacent leads as said comb structure is lowered toward said row of plurality of leads on said integrated circuit package.

2. The apparatus of claim 1, wherein said tooth unbends any of said respective two leads that is bent with less than said predetermined bend distance as said tooth fits down between said respective two adjacent leads.

3. The apparatus of claim 1, further comprising:

a pneumatic cylinder having said comb structure mounted thereon;

wherein said pneumatic cylinder with said comb structure is lowered down to reach an end point when each tooth of said comb structure fits between said respective two adjacent leads of said row of plurality of leads on said integrated circuit package;

and wherein said pneumatic cylinder with said comb structure does not reach said end point when any tooth of said comb structure does not fit between said respective two adjacent leads of said row of plurality of leads on said integrated circuit package.

4. The apparatus of claim 3, wherein said monitor further includes:

a switch, coupled to said pneumatic cylinder and said warning indicator, that is tripped to be open when said pneumatic cylinder is lowered down to reach said end point and that is tripped to be closed when said pneumatic cylinder does not reach said end point, and wherein said warning indicator provides said warning signal when said switch is tripped to be closed.

5. The apparatus of claim 1, wherein said warning indicator includes a lighting device that turns on when any tooth of said comb structure does not fit between said respective two adjacent leads as said comb structure is lowered toward said row of plurality of leads on said integrated circuit package.

6. The apparatus of claim 1, wherein said warning indicator includes an audible alarming device that turns on when any tooth of said comb structure does not fit between said respective two adjacent leads as said comb structure is lowered toward said row of plurality of leads on said integrated circuit package.

7. The apparatus of claim 1, wherein each lead of said row of plurality of leads has a width of approximately 17 mils (a thousandth of an inch), wherein said predetermined separation distance between two adjacent leads is approximately 33 mils (a thousandth of an inch), and wherein said predetermined bend distance is approximately 7 mils (a thousandth of an inch).

8. The apparatus of claim 1, wherein each tooth of said comb structure is comprised of polished hard carbide steel.

9. The apparatus of claim 1, further comprising:

an integrated circuit package flipper that flips said integrated circuit package such that said row of said plurality of leads is facing said teeth of said comb structure as said comb structure is lowered toward said row of plurality of leads on said integrated circuit package.

10. An apparatus for automatically detecting when a lead of an integrated circuit package is bent more than a predetermined bend distance, the integrated circuit package having a plurality of leads aligned in a row with a predetermined separation distance between each two adjacent leads, the apparatus comprising:

a comb structure having a plurality of teeth;

wherein a tooth of said comb structure fits between a respective two adjacent leads of said row of plurality of leads on said integrated circuit package when each of said respective two adjacent leads is bent toward each other with less than said predetermined bend distance as said comb structure is lowered toward said row of plurality of leads on said integrated circuit package;

and wherein said tooth of said comb structure does not fit between said respective two adjacent leads when any of said respective two adjacent leads is bent toward each other with more than said predetermined bend distance as said comb structure is lowered toward said row of plurality of leads on said integrated circuit package;

means for detecting when any tooth of said comb structure does not fit between said respective two adjacent leads as said comb structure is lowered toward said row of plurality of leads on said integrated circuit package; and means for providing a warning signal when any tooth of said comb structure does not fit between said respective two adjacent leads as said comb structure is lowered toward said row of plurality of leads on said integrated circuit package.

11. The apparatus of claim 10, wherein said tooth unbends any of said respective two leads that is bent with less than said predetermined bend distance as said tooth fits down between said respective two adjacent leads.

12. The apparatus of claim 10, wherein each lead of said row of plurality of leads has a width of approximately 17 mils (a thousandth of an inch), wherein said predetermined separation distance between two adjacent leads is approximately 33 mils (a thousandth of an inch), and wherein said predetermined bend distance is approximately 7 mils (a thousandth of an inch).

13. The apparatus of claim 10, wherein each tooth of said comb structure is comprised of polished hard carbide steel.

14. The apparatus of claim 10, further comprising:

means for flipping said integrated circuit package such that said row of said plurality of leads is facing said teeth of said comb structure as said comb structure is lowered toward said row of plurality of leads on said integrated circuit package.

15. A method for automatically detecting when a lead of an integrated circuit package is bent more than a predetermined bend distance, the integrated circuit package having a plurality of leads aligned in a row with a predetermined separation distance between each two adjacent leads, the method including the steps of:

A. lowering a comb structure having a plurality of teeth toward said row of plurality of leads on said integrated circuit package;

wherein a tooth of said comb structure fits between a respective two adjacent leads of said row of plurality of leads on said integrated circuit package when each of said respective two adjacent leads is bent toward each other with less than said predetermined bend distance as said comb structure is lowered toward said row of plurality of leads on said integrated circuit package;

and wherein said tooth of said comb structure does not fit between said respective two adjacent leads when any of said respective two adjacent leads is bent toward each other with more than said predetermined bend distance as said comb structure is lowered toward said row of plurality of leads on said integrated circuit package;

B. detecting when any tooth of said comb structure does not fit between said respective two adjacent leads as said comb structure is lowered toward said row of plurality of leads on said integrated circuit package; and C. providing a warning signal when any tooth of said comb structure does not fit between said respective two adjacent leads as said comb structure is lowered toward said row of plurality of leads on said integrated circuit package.

16. The method of claim 15, further including the step of:

unbending any of said respective two leads that is bent with less than said predetermined bend distance as said tooth fits down between said respective two adjacent leads.

17. The method of claim 15, wherein said warning signal is provided by a lighting device that is turned on when any tooth of said comb structure does not fit between said respective two adjacent leads as said comb structure is lowered toward said row of plurality of leads on said integrated circuit package.

18. The method of claim 15, wherein said warning signal is provided by an audible alarm that is turned on when any tooth of said comb structure does not fit between said respective two adjacent leads as said comb structure is lowered toward said row of plurality of leads on said integrated circuit package.

19. The method of claim 15, wherein each lead of said row of plurality of leads has a width of approximately 17 mils (a thousandth of an inch), wherein said predetermined separation distance between two adjacent leads is approximately 33 mils (a thousandth of an inch), and wherein said predetermined bend distance is approximately 7 mils (a thousandth of an inch).

20. The method of claim 15, wherein each tooth of said comb structure is comprised of polished hard carbide steel.

21. The method of claim 15, further including the step of:

flipping said integrated circuit package such that said row of said plurality of leads is facing said teeth of said comb structure as said comb structure is lowered toward said row of plurality of leads on said integrated circuit package.

* * * * *